United States Patent [19]
Wu et al.

[11] Patent Number: 5,572,014
[45] Date of Patent: Nov. 5, 1996

[54] HIGHLY EFFICIENT, ULTRAFAST OPTICAL-TO-ELECTRICAL CONVERTER AND METHOD OF OPERATING THE SAME

[75] Inventors: Ming-Chiang Wu; Tatsuo Itoh, both of Los Angeles, Calif.

[73] Assignee: The Regents of the University of California, Oakland, Calif.

[21] Appl. No.: 274,919

[22] Filed: Jul. 14, 1994

[51] Int. Cl.$^6$ ..................................................... H01J 40/14
[52] U.S. Cl. ............................ 250/208.2; 250/227.11
[58] Field of Search ........................... 250/208.1, 208.2, 250/208.3, 214.1, 227.14, 227.11, 551; 359/189, 193, 195

[56] References Cited

U.S. PATENT DOCUMENTS

5,405,006  4/1995  Schaffner et al. ................. 250/208.02

Primary Examiner—Stephone Allen
Attorney, Agent, or Firm—Daniel L. Dawes

[57] ABSTRACT

The periodic array of photodiodes are disposed in a passive optical waveguide electrically coupled in series with each other by microwave transmission line. The collective array of photodiodes coupled to the optical waveguide and microwave transmission line results in an increased bandwidth-efficiency product for the photodetector array as compared to any single photodetector within the array. High optical-to-electrical conversion efficiencies near unity are achieved at frequencies as high as several hundred GHz. High efficiencies are achieved by matching the group velocity of the optical waves within the optical waveguide with the group velocity of electrical signals being transmitted in the microwave transmission line by appropriate selection of the capacitance of each of the photodiodes. Power saturation is improved by decreasing the optical density within the active layer of the photodiodes. Optical coupling efficiencies from optical fibers into and from the optical waveguide are further improved by enlarging the optical mode size in the optical waveguide.

20 Claims, 5 Drawing Sheets

HIGHLY EFFICIENT, ULTRAFAST OPTICAL-TO-ELECTRICAL CONVERTER AND METHOD OF OPERATING THE SAME

BACKGROUND OF THE INVENTION

1. Field of the Invention

The invention relates to the field of photodetector devices and methods of photodetection, and in particular to photodetector arrays used in combination with optical waveguides.

2. Description of the Prior Art

Ultrafast photodetectors with high quantum efficiencies and high saturation power are required for microwave fiber-optic links and for optoelectronic generation of microwaves and millimeter waves. With the development of the erbium doped fiber amplifiers, ultrafast high-power photodetectors are also becoming necessary in high speed optical communication systems. In analog and microwave applications, high optical power is desired to improve the link gain in signal-to-noise ratio. However, ultrafast photodetectors tend to saturate at very low optical power because of the small detector sizes and high optical power density. Therefore, what is needed is a ultrafast photodetector with a high optical saturation power.

The performance of ultrafast photodetectors are measured by the product of bandwidth and efficiency. Conventional photodetectors with surface-normal illumination have a bandwidth-efficiency product of approximately 30 GHz. In conventional photodetectors, light propagates in the direction parallel to the transport of the electrical carriers and in order to achieve high efficiencies, a thick absorbing layer is required. The bandwidth of such devices is therefore limited by the long carrier transport time. As described by J. E. Bowers et al., "*Ultrawide-Band Long-Wavelength P-I-N Photodetectors*," IEEE J. Lightwave Technology, Volume LT-5, Number 10, Pages 1339–50 (October 1987) the product of the bandwidth and efficiency is limited to 0.45 av (1−R) where a is the absorption coefficient, v is the carrier velocity and R the reflectivity. Using typical device parameters, a conventional 100 GHz photodetector will then have an efficiency typically no higher than 31 percent.

Several approaches have been proposed in the prior art to increase the bandwidth-efficiency product of photodetectors, including cavity resonance-enhanced photodetectors (surface illumination) K. Kishino et al., "*Resonant Cavity Enhanced (RCE) Photodetectors*," IEEE J. Quantum Electron. Vol. QE-27, PP 2035–43 (1991) and A. Chin et al., "*Enhancement of Quantum Efficiency in Thin Photodiodes Through Absorptive Resonance*," J. Lightwave Technology, Volume 9, PP 321–28 (March 1991) and waveguide photodetectors (edge Illumination), J. E. Bowers et al., "*Ultrawide-Band Long Wavelength P-I-N Photodetectors*", IEEE J. Lightwave Technology, Volume LT-5, Number 10, PP 1339–50 (October 1987).

The prior art has attempted to avoid the fundamental limit imposed by the long carrier transport time by using waveguide photodetectors in which light propagates perpendicular to the carrier transport direction. However, these devices then encounter another upper limit, namely the "walk off" between the inputted light and the detected microwave signal along the waveguide due their velocity mismatch. A traveling wave photodetector has been proposed to increase the bandwidth-efficiency product, K. S. Giboney et al., "*Traveling Wave Photodetectors*," IEEE Photonics Technology Letters, Volume 4, Pages 1363–65 (1992). The bandwidth is, however, limited by velocity mismatch between the optical waves and the microwaves.

Very high bandwidth metal-semiconductor-metal (MSM) photodetectors using submicron finger width have also been devised as an attempted solution to this problem. Y. Chen et al., "*375 GHz Photodiode on Low Temperature Gallium Arsenide*," Appl. Phys. Lett. Volume 59, Pages 1984–86 (1991) and S. Y. Chou et al., "*Nanoscale Terahertz Metal-Semiconductor-Metal Photodetectors*," IEEE J. Quantum Electron, Volume 28 Number 10, PP 2358–68 (October 1992).

However, each of these approaches fails to address the limitation of high power saturation and, in fact, the resonance approach actually reduces the saturation power limit. Therefore, what is needed is a new photodetector design which has a high bandwidth and high efficiency in which the velocity matched structure still allows optical saturation power to be greatly increased.

BRIEF SUMMARY OF THE INVENTION

The invention is a circuit for providing transformation between optical and microwave signals. The circuit comprises a passive optical waveguide, and a microwave transmission line characterized by having a group velocity of microwaves traveling in the microwave transmission line matching the group velocity of the optical waves traveling in the optical waveguide. A plurality of photodiodes are periodically and optically coupled in series to the passive optical waveguide. The photodiodes are periodically and electrically coupled in series to the microwave transmission line so that output of the photodiodes is generated in phase on the microwave transmission line with an optical wave traveling on the optical waveguide serially coupled to the photodiodes. As a result, the circuit is fast and characterized by high bandwidth and high efficiency.

The optical waveguide is characterized by a reduced optical power density therein. Saturation power of the plurality of the photodiodes is increased by the reduced optical power density within the passive optical waveguide. The reduced optical power density is achieved by providing the optical waveguide with an enlarged mode size for optical waves propagating therein. The reduced optical power density is also achieved by providing a reduced confinement factor for the optical waveguide. The reduced confinement factor for the optical waveguide is provided by including a very thin absorbing layer, including for example a quantum well, for each of the plurality of photodiodes disposed in the optical waveguide. In the illustrated embodiment, the confinement factor of the optical waveguide is approximately 3 percent or less.

The group velocity matching between the microwave signals being transmitted in the microwave transmission line and the optical signals being transmitted in the optical waveguide is achieved by providing a selected capacitance value for each of the photodiodes.

The optical waveguide has a longitudinal direction, z, and each of the photodetectors has a length in the longitudinal direction of the optical waveguide of the order of a few micrometers.

In one application the photodetector circuit further comprises a corresponding plurality of active devices. Each one of the active devices is coupled to one of the plurality of photodiodes. The active devices couple the photodiodes to the microwave transmission line at serially coupled points on the microwave transmission line so that a traveling wave amplifier is formed in combination.

Each of the active devices is a transistor having a base, collector and emitter. In one embodiment, the photodiode coupled to the optical waveguide is coupled to the base of the transistor so that the traveling wave amplifier amplifies signals propagated along the optical waveguide for amplified coupling into the microwave transmission line. In another embodiment, each of the photodiodes is coupled to one of the emitters or collectors of each the transistor and the base of each transistor is coupled to serially connected points within the microwave transmission line so that the microwave signals propagating on the microwave transmission line are amplified and coupled into the optical waveguide to provide modulated optical signals.

The invention is also characterized as a method for providing transformation between optical and microwave signals. The method comprises the steps of propagating an optical signal along a passive optical waveguide. The passive optical waveguide has a characteristic group velocity for optical signals. The optical waveguide has a plurality of photodetectors coupled thereto in a periodic array along the direction of optical signal propagation within the optical waveguide. Electrical signals generated by the photodetectors in response to the optical signal are collected. The electrical signals are copropagating with the optical signal in the optical waveguide. The copropagating electrical signals are coupled to a microwave transmission line, which is characterized by having a characteristic group velocity for microwave signals propagating in the microwave transmission line matching the group velocity of the optical signals propagating in the optical waveguide. As a result, transformation is permitted between the optical signals within the optical waveguide and electrical signals within the microwave transmission line.

The method further comprises the step of increasing saturation power of the plurality of photodetectors within the optical waveguide by reducing optical power density in the optical waveguide.

The step of providing an optical waveguide with reduced optical density is performed by enlarging mode size of optical signal propagation within the optical waveguide.

The step of providing an optical waveguide of reduced optical density comprises the step of reducing optical confinement factor within the optical waveguide, more specifically reducing the refractive index difference of the waveguide layers or reducing the thickness of the absorbing layer.

The photodiodes are PIN photodiodes or other known photodetector structures, and the step of providing an optical waveguide with a reduced optical confinement factor comprises the step of utilizing a very thin layer or a quantum well for each intrinsic layer within each of the PIN photodiodes.

The step of collecting copropagating signals through the plurality of photodetectors periodically disposed in the optical waveguide comprises the step of collecting the copropagating signals along an extended array of the photodetectors collectively extending the order of 100 micrometers to millimeters in length in the direction of propagation of the optical signals within the optical waveguide so that the quantum efficiency of the overall circuit is high.

Finally, the invention is still further characterized as a circuit for transforming signals between an optical waveguide and a microwave transmission line. The circuit comprises a plurality of PIN photodiodes disposed in the optical waveguide and electrically coupled to serially connected points within the microwave transmission line. The photodiodes each have a capacitance such that group velocity of microwave signals transmitted in the transmission line when connected to the plurality of photodiodes approximately equals the group velocity of optical signals transmitted in the optical waveguide.

The invention can be better visualized by now turning to the following drawings wherein like elements are referenced by like numerals.

Turn now to the following detailed description wherein the preferred embodiment is illustrated along with several additional embodiments following within the scope of the invention.

DETAILED DESCRIPTION OF THE PREFERRED EMBODIMENTS

The periodic array of photodiodes are disposed in a passive optical waveguide electrically coupled in series with each other by microwave transmission line. The collective array of photodiodes coupled to the optical waveguide and microwave transmission line results in an increased bandwidth-efficiency product for the photodetector array as compared to any single photodetector within the array. High optical-to-electrical conversion efficiencies near unity are achieved at frequencies as high as several hundred GHz. High efficiencies are achieved by matching the group velocity of the optical waves within the optical waveguide with the group velocity of electrical signals being transmitted in the microwave transmission line by appropriate selection of the capacitance of each of the photodiodes.

Power saturation is improved by decreasing the optical density within the optical waveguide. Optical coupling efficiencies from optical fibers into and from the optical waveguide are further improved by enlarging the mode size to match the numerical aperture of the optical fiber.

The ultrafast photodetector of the invention, which is characterized by high bandwidth and high efficiency, is labelled in the specification as an optical-to-microwave transformer (OMT). It is comprised of an input optical waveguide with periodically loaded photodiodes and a velocity matched output microwave transmission line. Theoretical simulations show the device having a bandwidth of greater than 300 GHz with an external quantum efficiency of 46 percent. The OMT also exhibits an optical input coupling efficiency of 95 percent. The photodetector of the invention is characterized by the separation and velocity matching of the optical and microwave waveguides. The optical waveguide is optimized for high input coupling efficiency and the microwave transmission line is optimized for velocity matching.

Figure 1:
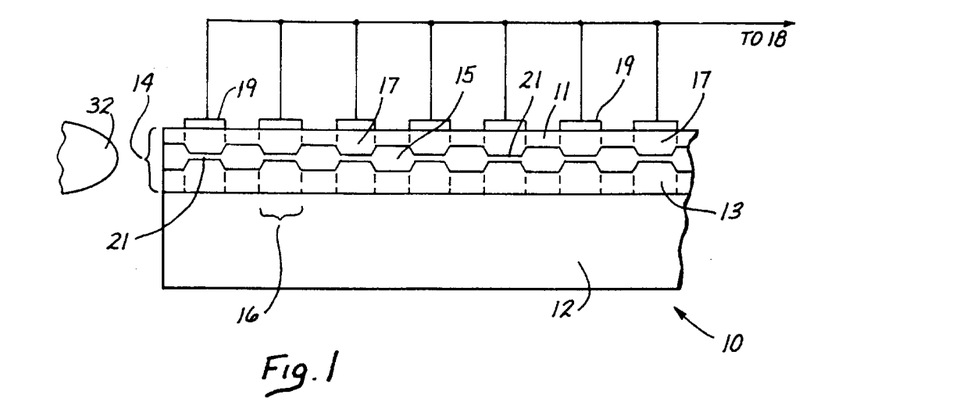
FIG. 1 is a simplified cross sectional view of an optical-to-microwave transformer devised according to the invention.
Figure 2:
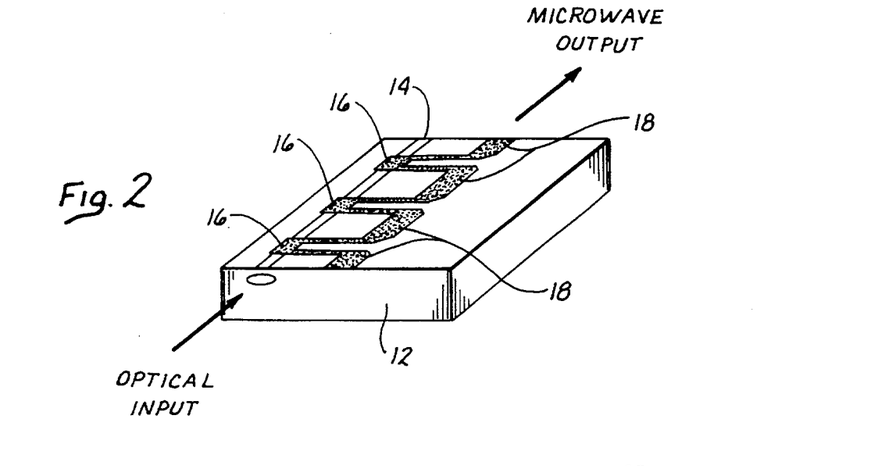
FIG. 2 is a perspective schematic view of the optical-to-microwave transformer of FIG. 1.

The operation of the device is illustrated in principle in the cross sectional diagrammatic view of FIG. 1 wherein the device (OMT), generally denoted by reference numeral 10, is shown as disposed on a GaAs semi-insulating substrate 12 in which a passive optical waveguide 14 is defined linked to a plurality of active photodiodes 16. Photodiodes 16 comprise an array of ultrafast PIN photodiodes with a small active area and thin absorbing region. In the illustrated embodiment each PIN photodiode is provide with an N-type AlGaAs layer 13 disposed on substrate 12 on which layer 13 is disposed a thin layer 21, intrinsic GaAs layer 15 followed by a P-type AlGaAs layer 17. Layer 15 is typically between 0.01 to 1.0 micron thick. A metal contact 19 is then provided on layer 17 for coupling to microwave transmission line 18. Each photodiode 16 is isolated electrically from its adjacent photodiode 16 by means of a resistive implantation, such as a hydrogen implantation region 11. Layers 13, 15 and 17 collectively form in the horizontal direction of FIG. 1 an optical waveguide 14 of which layer 15 in which quantum wells 21 are defined comprising the center axis of optical waveguide 14.

Each photodiode 16 has a bandwidth of several hundred GHz, though the efficiency for each is low. A high overall efficiency of device 10 is achieved by in-phase summing of the responses of photodiode 16, which summation requires the velocity of the input optical wave to be matched to the output microwave signals.

Photodiodes 16 comprise a serial or periodic array which is coupled to a microwave transmission line 18, is also disposed on or in substrate 12. In a typical transmission line on semi-insulating gallium arsenide substrates, microwaves will travel with a group velocity of approximately 20 percent faster than optical waves. The capacitance of each of photodiodes 16 are chosen to provide an effective "slow wave" structure when combined to achieve velocity matching. The slow wave structure is conventional and generally described by R. E. Collin, Foundations for Microwave Engineering, McGraw Hill Book Company, New York 1972, and H. Y. Lee et al., Int. J. Infrared and Millimeter Waves, Volume 10, Number 3, Pages 321–35 (March 1989). The microwave velocity in waveguide 18 is slowed down by the periodic capacitive loading on the microwave transmission line. The capacitance is provided by active PIN photodiodes 16.

Consider for a moment the external quantum efficiency of OMT 10 estimated as a function of frequency as a product of various factors as shown in equation #1:

$$n_{total} = n_{OMT} n_{tr} n_{RC} n_C \quad (1)$$

where $n_{OMT}$ is the intrinsic response of OMT 10 which includes the residue velocity mismatch, microwave dispersion and loss;

$n_{tr}$ is the transit time response;

$n_{RC}$ is the parasitic RC effect; and $n_C$ is the coupling efficiency.

The fiber coupling efficiency is included in the total efficiency calculation because it is dependant on the structure of the device. As described below optimization of the photodetector for bandwidth-efficiency product will affect the fiber coupling at the same time. The effective transit time, $n_{tr}$, is generally described by G. Lucovsky et al., "Transit Time Considerations in PIN Diodes," J. Appl. Phys. Volume 27, Pages 622–28 (1964).

Figure 3:
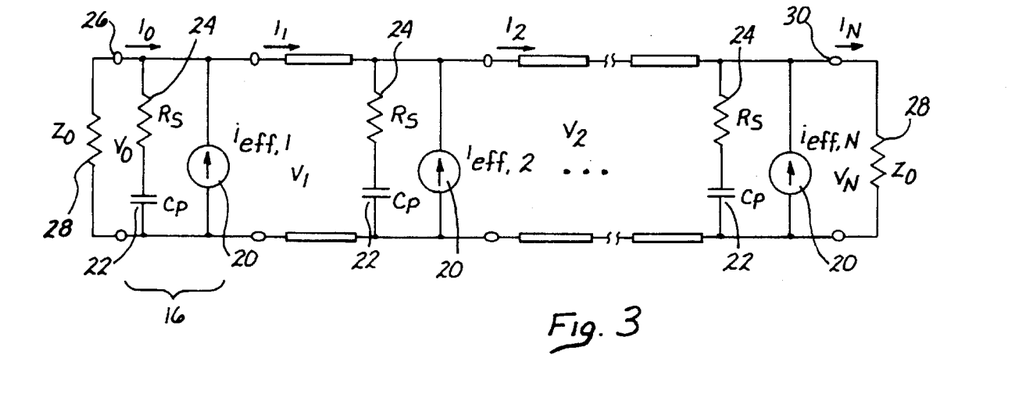
FIG. 3 is a schematic equivalent circuit to the optical-to-microwave transformer of FIGS. 1 and 2.

Consider first just the intrinsic OMT efficiency, $n_{OMT}$. The equivalent circuit of OMT 10 is illustrated in FIG. 3. Each photodiode 16 is represented by an intrinsic photodiode or photocurrent source 20 shunted by a junction capacitor 22 in series with a contact resistance 24. The plurality of photodiodes 16 are coupled at their input 26 and output 30 to a characteristic waveguide impedance 28.

The equivalent circuit of FIG. 3 can be analyzed and computer simulated. One method of analysis is the transmission matrix method described by R. E. Collin, Foundations for Microwave Engineering, McGraw Hill Book Company, New York 1972. Without considering the details of the mathematical analysis, the output signals from OMT 10 with N-photodiodes 16 can be predicted. The total photocurrent at output 30, $I_N$, can be solved by imposing boundary conditions on input terminals 26 and output terminals 30. Impedance matching maximizes the bandwidth, since multiple reflections of microwave signals are thereby eliminated. Alternatively, a high impedance termination can be used to increase the detector responsivity at the expense of bandwidth. Any type of impedance termination or other boundary condition on the microwave waveguide now known or later devised is expressly contemplated as being within the scope of the invention. In the illustrated embodiment, a matched impedance termination is assumed for both the input and output terminals 26 and 30 through other terminations could be employed and analyzed if desired.

In the simulation described below, OMT 10 is assumed to include a coplanar waveguide 18 on semi-insulating gallium arsenide substrate 12. A coplanar waveguide has a characteristic impedance of 50 ohms and the other parameters of the transmission line have been taken from K. C. Gupta et al., "Microstrip Lines and Slot Lines," Artech House, Dedham, Mass. (1979). Any type of waveguide desired could be used consistent with the teachings of the invention. The simulation, the results of which are depicted in FIGS. 4 and 5, includes carrier transit time effects, dispersion and losses both in metal and dielectric in coplanar waveguide 18, residue velocity mismatch between microwave and optical transmissions lines, and input optical coupling efficiency from a lensed optic fiber 32 depicted in FIG. 1.

Figure 4:
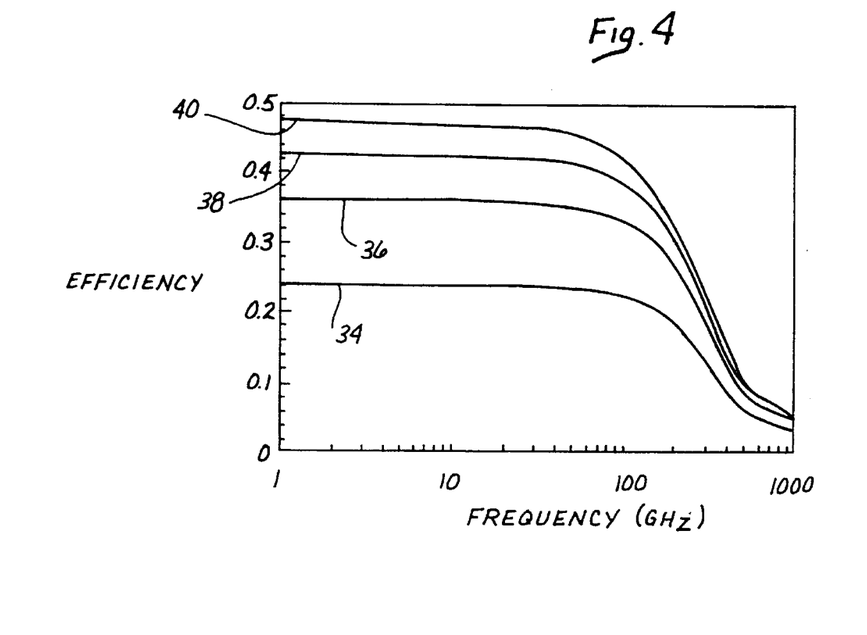
FIG. 4 is a graph of the frequency response of the optical-to-microwave transformer using 1, 3 and 5 photodiodes.

FIG. 4 is a computed graph which shows the total external quantum efficiency, which is defined as the ratio of the number of incident optical photons to the number of current carriers generated, expressed as a percentage as a function of frequency for an OMT 10 variously comprised of 1, 2, 3 and 5 photodiodes 16 in array. Each photodiode 16 has been assumed to be 4 microns long and 1 micron wide. As described below, the confinement factor of the optical waveguide is intentionally reduced so that the input optical coupling efficiency is greater than 95 percent. The structural dependance of the external quantum efficiency is discussed below.

As shown in FIG. 4, in connection with curve 34 for a single photodiode 16, the maximum efficiency is approximately 24 percent with a bandwidth of approximately 350 GHz. Efficiency gradually increases with the increasing number of photodiodes as seen by comparison of curves 34, 36, 38 and 40. When OMT 10 has 5 diodes, as shown by curve 40, the maximum efficiency reaches 46 percent, while the bandwidth has only been moderately reduced to 300 GHz. It should be noted that 50 percent efficiency is a theoretical limit for matched input terminations since only the co-propagating electrical signal with the optical wave is collected.

Figure 5:
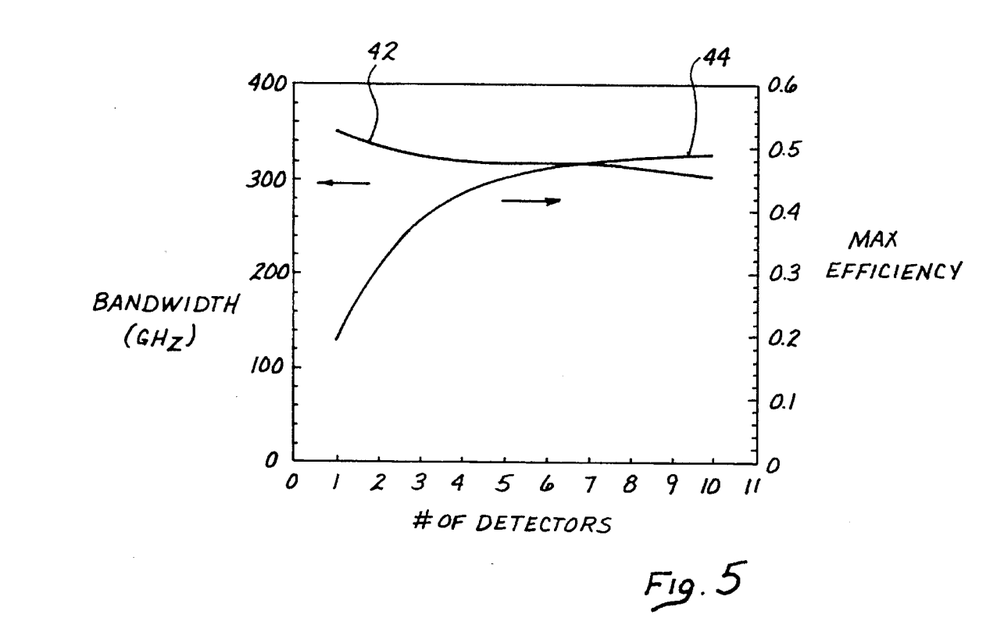
FIG. 5 is a graph of the bandwidth and efficiency of the optical-to-microwave transformer sketch as a function of the number of diodes.

FIG. 5 is computed graph of the bandwidth and efficiency as a function of the number of photodetectors 16 used in OMT 10. Layer 21 is assumed to be 0.15 micron wide and 3 microns long with aluminum constituent in layers 13 and 17 being approximately 10% by number of atoms. FIG. 5 illustrates the variation of the 3 db bandwidth as shown by curve 42 and the maximum quantum efficiencies as shown by curve 44. As the number of photodetectors 16 increase, efficiency increases steadily towards the theoretical limit of 50 percent. Meanwhile, the bandwidth of OMT 10 remains substantially constant, or varies only slightly, as the number of photodetectors 16 increase beyond three.

One of the unique features of OMT 10 is its high optical saturation power. Increased saturation power is achieved by reducing the optical power density in waveguide 14. The reduction of optical power density in waveguide 14 is achieved by enlarging the mode size of the optical waveguide and employing a very small optical confinement factor. The mode size is a measure of the spreading of the optical wave throughout the cross section of optical waveguide 14. The confinement factor is a measure of the amount of the optical wave confined to central layer 21. Since the optical saturation power is inversely proportional to the confinement factor, the saturation power is increased by an order of magnitude by dramatically reducing the confinement factor, e.g. using a few quantum wells as the absorbing layer. Reducing the confinement factor, however, increases the total length of the photodetector array 10. This results in a bandwidth penalty in a conventional waveguide photodetector. In OMT 10, the bandwidth is only slightly reduced because the group velocity matching between the optical and microwave signals allows the total photodetector length to be extended to several millimeters.

Figure 6:
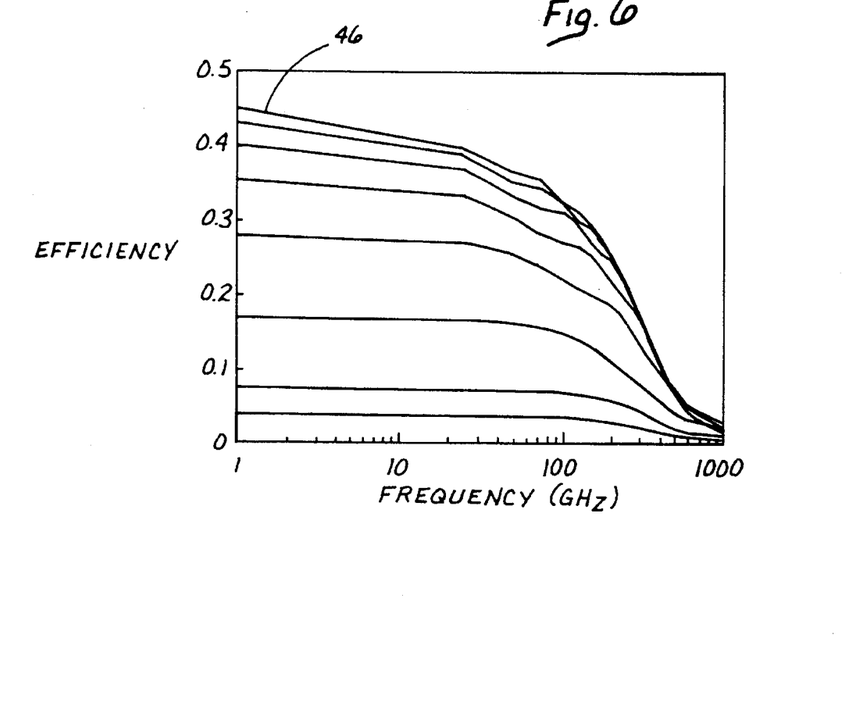
FIG. 6 is a graph of the efficiency as a function of frequency in the optical-to-microwave transformer at high saturation power.

FIG. 6 is a graph of the efficiency versus the frequency for OMT 10 when the confinement factor is reduced to only 3 percent. With a confinement factor of 3 percent, each photodetector 16 has efficiency of only 4 percent. However, as shown in FIG. 6, with 30 PIN photodiodes 16 as illustrated by curve 46, the maximum quantum efficiency increases to 45 percent while the bandwidth is only moderately reduced to 250 GHz.

Figure 7:
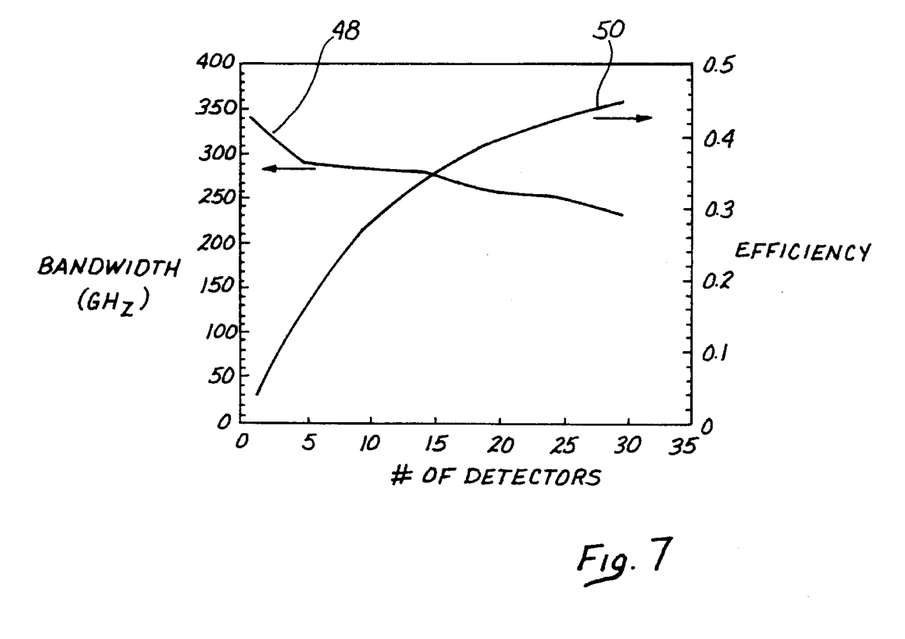
FIG. 7 is the bandwidth and efficiency of the optical-to-microwave transformer at high saturation power.

FIG. 7 is a corresponding graph to FIG. 6 showing the bandwidth and efficiency of OMT 10 as a function of the number of photodetectors when used with a reduced confinement factor to 3 percent as shown in FIG. 6. Bandwidth is illustrated by curve 48 and the efficiency by curve 50.

One of the major drawbacks of waveguide photodetectors has been their low optical input coupling efficiency. In a conventional waveguide photodetector, the absorbing or active waveguide length is kept short in order to reduce the RC limit. As a result, the optical mode size is small, which results in small input coupling efficiencies. An attempt has been made to use multimode waveguide structures to improve coupling efficiencies which, however, has only resulted improvements from 40 to 68 percent. See for example K. Kato et al., "*A High Efficiency 50 GHz Indian Gallium Arsenide Multimode Waveguide Photodetector,*" IEEE J. Quantum Electron, Volume QE-28, pp 2728–35 (1992). However, in the conventional solution, asR coupling efficiency is improved, the misalignment tolerance is dramatically reduced.

In contrast, in OMT 10, long photodetectors 16 with high bandwidth can be designed without penalizing the bandwidth of the overall device 10. The extra length is used to optimize the input optical coupling efficiency as well. The coupling efficiency from a lensed single mode optical fiber is numerically simulated by Equation 2:

$$\eta_c = \frac{\left| \int_{-r}^{r} \int_{-\sqrt{r^2-x^2}}^{\sqrt{r^2-x^2}} \phi_d(x,y) \phi_f^*(x,y) dx dy \right|^2}{\int \int_{-\infty}^{\infty} |\phi_d(x,y)|^2 dy dx \int \int_{-\infty}^{\infty} |\phi_f(x,y)|^2 dy dx}$$

Where $\phi_d$ is a far field of the waveguide at the tip of the fiber lens, $\phi_f$ is a complex field distribution in the fiber after passing through the lens.

Figure 8:
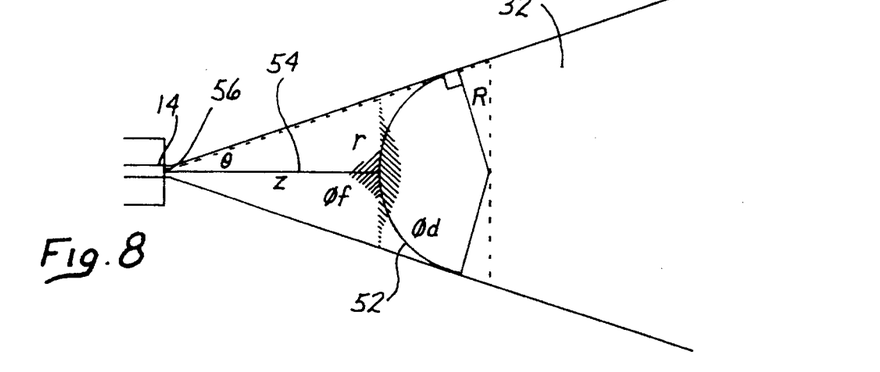
FIG. 8 is a schematic diagram depicting a model of the fiber optic to waveguide coupling.
Figure 9:
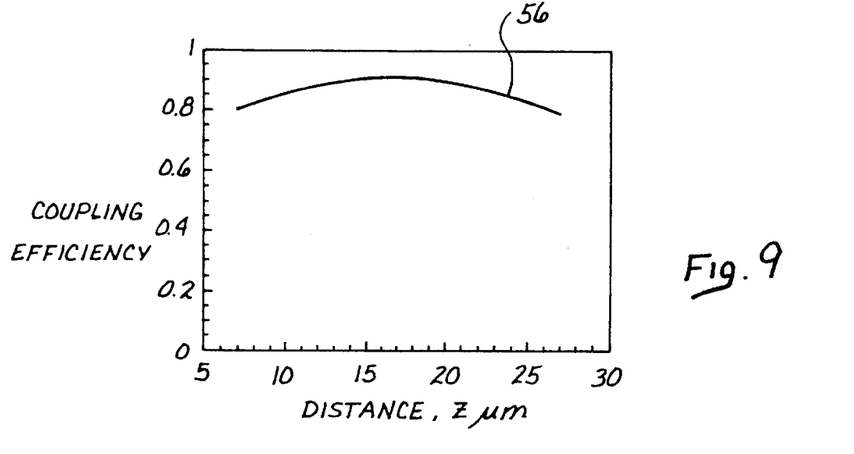
FIG. 9 is a graph illustrating the optical coupling efficiency of the optical-to-microwave transformer verses the on-axis distance between the transformer and a lensed fiber.

FIG. 8 is a diagrammatic side view of the geometry realized between optical waveguide 14 and lens fiber tip 32. Lens 52 of optical fiber 32 has a radius R and is positioned at a distance 54, z, from edge 56 of waveguide 14. A computed simulation of the coupling efficiency is illustrated in the graph of FIG. 9 as a function of distance, z. Curve 56 illustrates that efficiencies of approximately 90 percent can be achieved with very relaxed misalignment tolerance.

Figure 10:
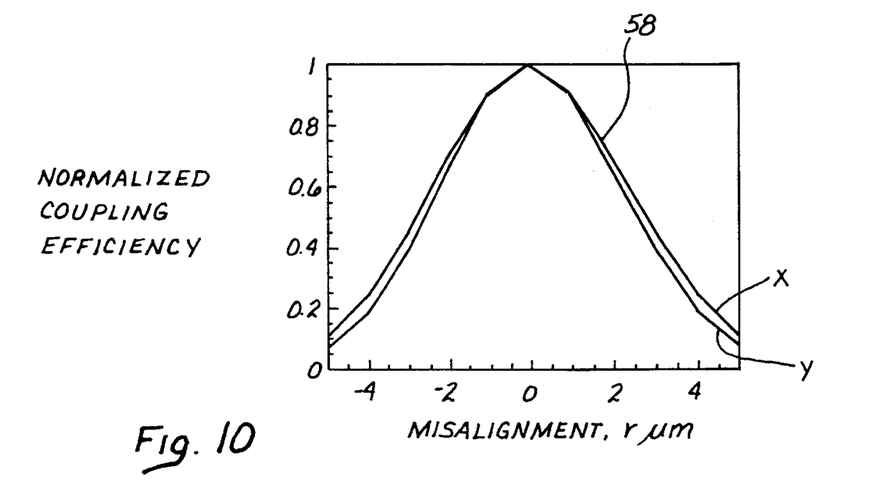
FIG. 10 is a graph of normalized coupling efficiency as a function of the lateral misalignment tolerance of the optical-to-microwave transformer.

Curves 58 of FIG. 10 illustrates the lateral misalignment tolerance in the direction of the orthogonal x and y axes as measured in microns away from the longitudinal axis which is defined as zero. Coupling of over 80 percent is still achieved within the lateral misalignment range of plus or minus 2.5 microns.

OMT 10 is thus an ultrafast photodetector device having applications in analog fiber optics links and optoelectronic generation/processing circuits or devices for millimeter waves. Bandwidths of 300 GHz and quantum efficiencies of 45 percent can be achieved with high optical saturation powers and high optical input coupling efficiencies of greater than 90 percent.

Figure 11:
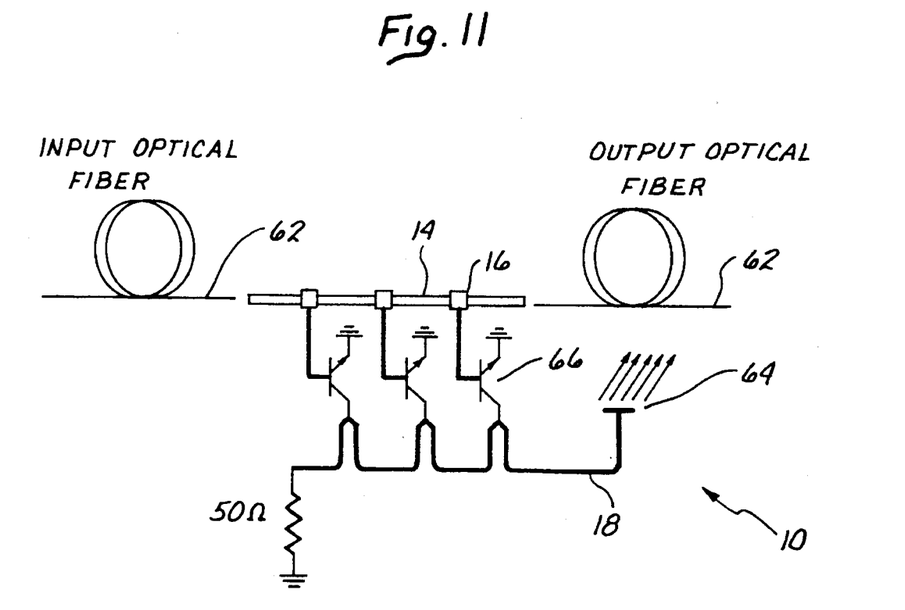
FIG. 11 is a schematic diagram of a traveling amplifier incorporating the optical-to-microwave transformer of the invention as used in an optical fiber linked, wireless communication network.

FIG. 11 illustrates an application of OMT 10 used in optical fiber linked, wireless communication network. A small fractional light is tapped out from optical fiber links 62 extending between the two microwave stations by photodiodes 16. The detector light is amplified by the integrated traveling wave amplifier comprised of corresponding transistors 66 to drive an integrated antenna 64. In FIG. 11 each photodiode 16 is coupled to the base of its corresponding transistor 66, whose emitter is grounded and whose collector is coupled to microwave transmission line 18. Microwave transmission line 18 is coupled at is output to integrated circuit antenna 64. OMT 10 is advantageous over conventional use of a cascaded photodetectors and amplifiers because the parasitics of photodetector 16 can be tuned out by the input transmission lines.

Figure 12:
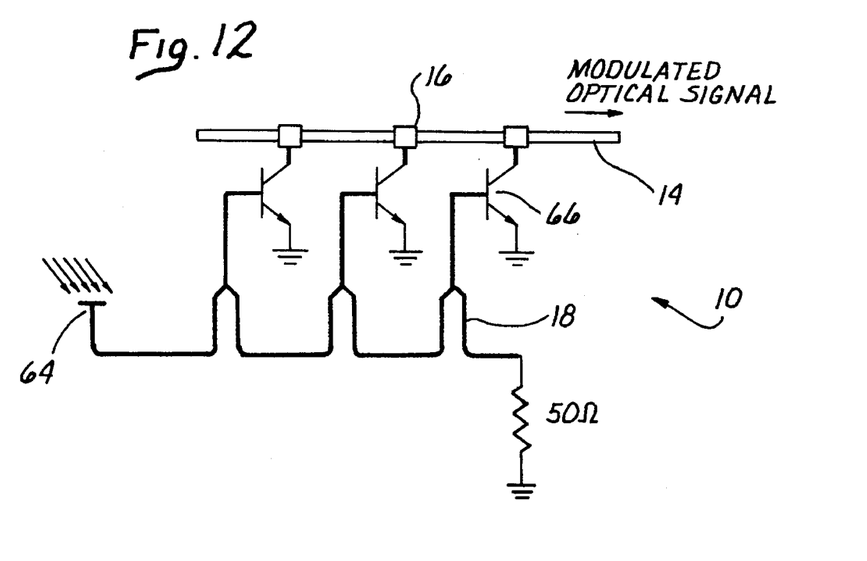
FIG. 12 is a schematic diagram of a traveling amplifier incorporating the optical-to-microwave transformer of the invention as used in a wireless microwave-to-optical modulator.

The role of the optical output transmission line 62 and the microwave output transmission line 60 can be reversed as shown in FIG. 12 if photodectors 16 are replaced by modulators 16'. A microwave signal is received by an integrated antenna 64 and is coupled to the bases of corresponding transistors 66. The emitters of transistors 66 are grounded and their collectors are coupled to modulators 16'. The received microwave signal is directly amplified by the traveling wave amplifier of OMT 10 to generate a modulated optical signal in optical wave guide 14.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptionally equivalent, and also what essentially incorporates the essential idea of the invention.

We claim:

1. A circuit for providing transformation between optical and microwave signals comprising:

a passive optical waveguide;

a microwave transmission line characterized by a group velocity for microwaves traveling in said microwave transmission line matching a group velocity of optical waves traveling in said optical waveguide; and a plurality of photodiodes periodically optically coupled in series to said passive optical waveguide, said photodiodes being periodically and electrically coupled in series to said microwave transmission line so that output of said photodiodes is generated in phase on said microwave transmission line with an optical wave traveling on said optical waveguide serially coupled to said photodiodes, whereby said circuit is characterized by high speed, high bandwidth and high efficiency.

2. The circuit of claim 1 wherein said optical waveguide is characterized by a reduced optical power density therein, saturation power of said plurality of said photodiodes being increased by said reduced optical power density within said active layer of said photodiodes.

3. The circuit of claim 2 wherein said reduced optical power density is achieved by providing said optical waveguide with an enlarged mode size for optical waves propagating therein.

4. The circuit of claim 2 wherein said reduced optical power density is achieved by providing a reduced confinement factor for said optical waveguide.

5. The circuit of claim 4 wherein said reduced confinement factor for said optical waveguide is provided by including thin layer as an absorbing layer for each of said plurality of photodiodes disposed in said optical waveguide.

6. The circuit of claim 1 wherein each of said photodiodes has a capacitance, C, and wherein group velocity matching between said microwave signals being transmitted in said microwave transmission line and said optical signals being transmitted in said optical waveguide are matched by providing a selected capacitance value for each of said photodiodes.

7. The circuit of claim 2 wherein group velocity matching between said microwave signals being transmitted in said microwave transmission line and said optical signals being transmitted in said optical signals being transmitted in said optical waveguide are matched by providing a selected capacitance value for each of said photodiodes.

8. The circuit of claim 5 wherein said thin layer is a quantum well.

9. The circuit of claim 1 wherein said optical waveguide has a longitudinal direction, z, and large optical mode size so that fiber optic-to-optical waveguide coupling efficiency is made less sensitive to misalignments in said longitudinal direction, z, of said optical waveguide as well as orthogonal thereto.

10. The circuit of claim 1 further comprising a corresponding plurality of active devices each one of said active devices being coupled to one of said plurality of photodiodes, said active devices coupling said photodiodes to said microwave transmission line at serially coupled points on said microwave transmission line so that a traveling wave amplifier is formed in combination.

11. The circuit of claim 10 wherein each of said active devices is a transistor having a base, collector and emitter, and wherein said photodiode coupled to said optical waveguide is coupled to said base of said transistor so that said traveling wave amplifier amplifies signals propagated along said optical waveguide for amplified coupling into said microwave transmission line.

12. The circuit of claim 10 wherein each of said active devices is a transistor having a base, collector and emitter and wherein each of said photodiodes is coupled to one of said emitters or collectors of each said transistor and wherein said base of each transistor is coupled to serially connected points within said microwave transmission line so that the microwave signals propagating on said microwave transmission line are amplified and coupled into said optical waveguide to provide modulated optical signals.

13. A method for providing transformation between optical and microwave signals comprising the steps of:

propagating an optical signal along a passive optical waveguide, said passive optical waveguide having a characteristic group velocity for optical signals therein, said optical waveguide having a plurality of photodetectors coupled thereto in a periodic array along the direction of optical signal propagation within said optical waveguide;

collecting electrical signals generated by said photodetectors in response to said optical signal, which electrical signals are copropagating with said optical signal in said optical waveguide; and coupling said copropagating electrical signals to a microwave transmission line characterized by having a characteristic group velocity for microwave signals propagating in said microwave transmission line matched to said group velocity of said optical signals propagating in said optical waveguide, whereby transformation is permitted between said optical signals within said optical waveguide and electrical signals within said microwave transmission line.

14. The method of claim 13 further comprises the step of increasing saturation power of said plurality of photodetectors within said optical waveguide by reducing optical power density in said optical waveguide.

15. The method of claim 14 wherein said step of providing an optical waveguide with reduced optical density is performed by enlarging mode size of optical signal propagation within said optical waveguide.

16. The method of claim 14 wherein said step of providing an optical waveguide of reduced optical density comprises the step of reducing optical confinement factor within said optical waveguide.

17. The method of claim 15 wherein said step of providing an optical waveguide of reduced optical density comprises the step of reducing the refractive index difference of the waveguide layers.

18. The method of claim 16 wherein said photodiodes are PIN photodiodes and where said step of providing an optical waveguide with a reduced optical confinement factor comprises the step of utilizing a thin layer for each intrinsic layer within each of said PIN photodiodes.

19. The method of claim 15 wherein said step of enlarging the mode size renders optical coupling efficiency between an optic fiber and said optical waveguide less sensitive to misalignments between said optical fiber and said optical waveguide both in said direction of propagation as well as lateral thereto.

20. A circuit for transforming signals between an optical waveguide and a microwave transmission line comprising:

a plurality of PIN photodiodes disposed in said optical waveguide and electrically coupled to serially connected points within said microwave transmission line, said photodiodes each having a capacitance such that group velocity of microwave signals transmitted in said transmission line when connected to said plurality of photodiodes approximately equals the group velocity of optical signals transmitted in said optical waveguide.

* * * * *